United States Patent
Nam

(10) Patent No.: US 11,243,256 B2
(45) Date of Patent: Feb. 8, 2022

(54) SYSTEM AND METHOD FOR DIAGNOSING LOW-VOLTAGE BATTERY STATE

(71) Applicant: LG ENERGY SOLUTION, LTD., Seoul (KR)

(72) Inventor: In Ho Nam, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 67 days.

(21) Appl. No.: 16/479,073

(22) PCT Filed: Mar. 14, 2018

(86) PCT No.: PCT/KR2018/002989
§ 371 (c)(1),
(2) Date: Jul. 18, 2019

(87) PCT Pub. No.: WO2018/186602
PCT Pub. Date: Oct. 11, 2018

(65) Prior Publication Data
US 2020/0033417 A1    Jan. 30, 2020

(30) Foreign Application Priority Data
Apr. 6, 2017  (KR) .................. 10-2017-0044680

(51) Int. Cl.
*G01R 31/36*  (2020.01)
*G01R 31/396*  (2019.01)
*G01R 31/3835*  (2019.01)

(52) U.S. Cl.
CPC ..... *G01R 31/3648* (2013.01); *G01R 31/3835* (2019.01); *G01R 31/396* (2019.01)

(58) Field of Classification Search
CPC .............. G01R 31/3835; G01R 31/396; G01R 31/3648; G01R 31/36; G01R 31/50; G01R 31/382; Y02E 60/10; H01M 10/482
See application file for complete search history.

(56) References Cited

U.S. PATENT DOCUMENTS 5,798,629 A    8/1998  Tersuchi
8,334,673 B2  12/2012  Ishikawa et al.
(Continued)

FOREIGN PATENT DOCUMENTS

EP    1070965 A2    1/2001
JP    H08-336201 A  12/1996
(Continued)

OTHER PUBLICATIONS

Extended European Search Report, dated Nov. 22, 2019, for European Application No. 18781752.3.
(Continued)

*Primary Examiner* — Tung X Nguyen
*Assistant Examiner* — Feba Pothen
(74) *Attorney, Agent, or Firm* — Birch, Stewart, Kolasch & Birch, LLP

(57) ABSTRACT

A system and a method of diagnosing a state of a low-voltage battery, in which, in order to diagnose the state of a low-voltage battery (12V aux battery) provided at a low-voltage side, a daisy chain circuit unit receives a voltage from the low-voltage battery and outputs one or more result signals, and an isolator unit, which electrically insulates a high-voltage side and the low-voltage side, converts the outputted one or more result signals and provides the converted signals to a control unit, thereby diagnosing a state of the low-voltage battery at the low-voltage side by using the control unit provided at the high-voltage side.

14 Claims, 7 Drawing Sheets

(56) References Cited

U.S. PATENT DOCUMENTS

| | | |
|---|---|---|
| 8,970,062 B2 | 3/2015 | Kunimitsu et al. |
| 10,018,682 B2 | 7/2018 | Kaupp et al. |
| 2008/0238432 A1 | 10/2008 | Botker et al. |
| 2010/0301868 A1 | 12/2010 | Ishikawa et al. |
| 2010/0308835 A1* | 12/2010 | Sekizaki .............. G01R 31/396 324/434 |
| 2011/0060236 A1 | 3/2011 | Sekizaki et al. |
| 2011/0215639 A1 | 9/2011 | Kurosaki |
| 2013/0076129 A1 | 3/2013 | Kunimitsu et al. |
| 2015/0191102 A1 | 7/2015 | Kubo et al. |
| 2016/0003915 A1 | 1/2016 | Kamei |
| 2016/0111917 A1* | 4/2016 | Ghosh .................... H02J 9/061 307/66 |
| 2016/0356857 A1 | 12/2016 | Kaupp et al. |
| 2017/0126036 A1* | 5/2017 | Dulle .................... G06F 30/13 |

FOREIGN PATENT DOCUMENTS

| | | |
|---|---|---|
| JP | 2010-116024 A | 5/2010 |
| JP | 2010-279146 A | 12/2010 |
| JP | 2014-171285 A | 9/2014 |
| JP | 2016-15277 A | 1/2016 |
| JP | 2016-197115 A | 11/2016 |
| KR | 10-2013-0033196 A | 4/2013 |
| KR | 10-2013-0034618 A | 4/2013 |
| KR | 10-2013-0065351 A | 6/2013 |
| KR | 10-2016-0062194 A | 6/2016 |

OTHER PUBLICATIONS

International Search Report for PCT/KR2018/002989 (PCT/ISA/210) dated Jun. 11, 2018, with English translation.

* cited by examiner

[Figure 1]
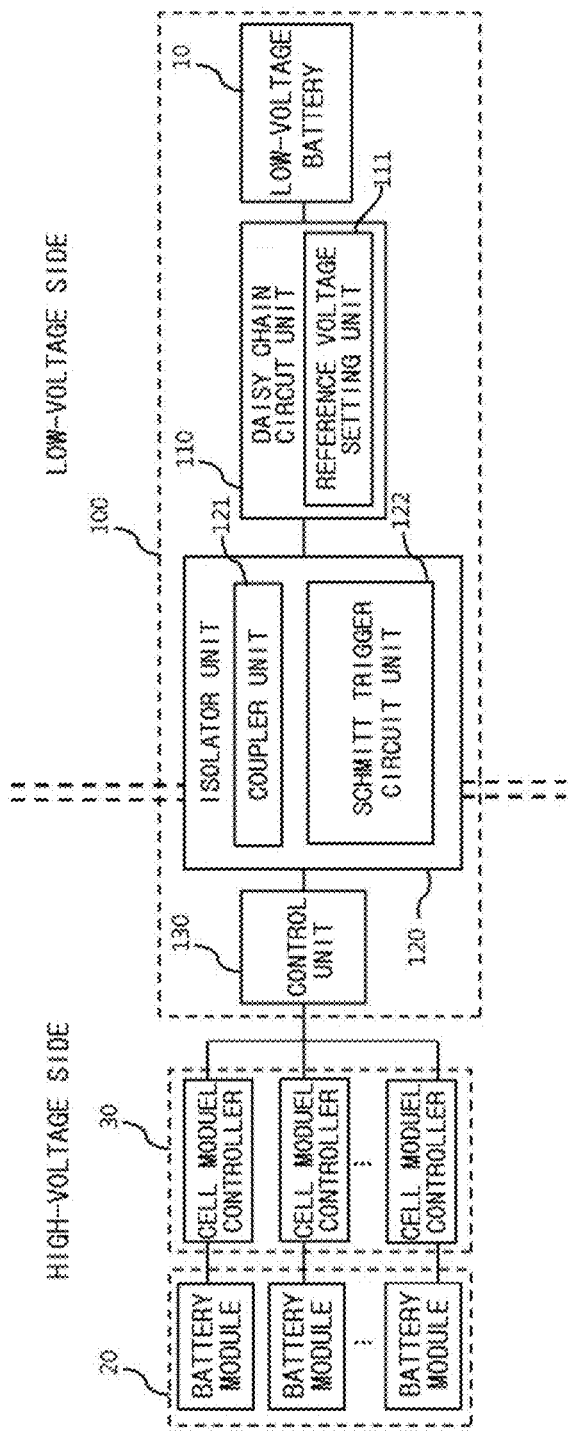

[Figure 2]
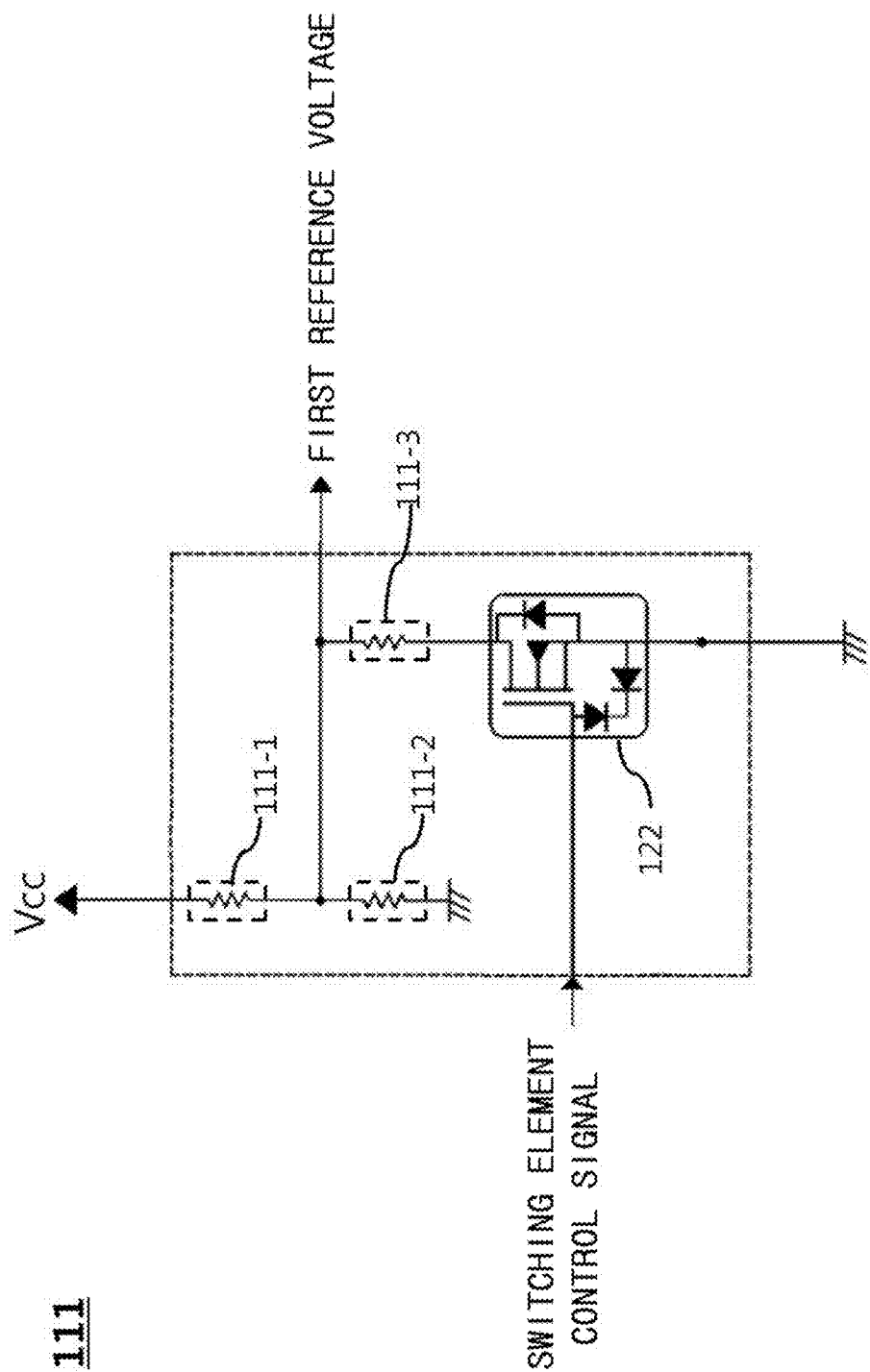

[Figure 3]
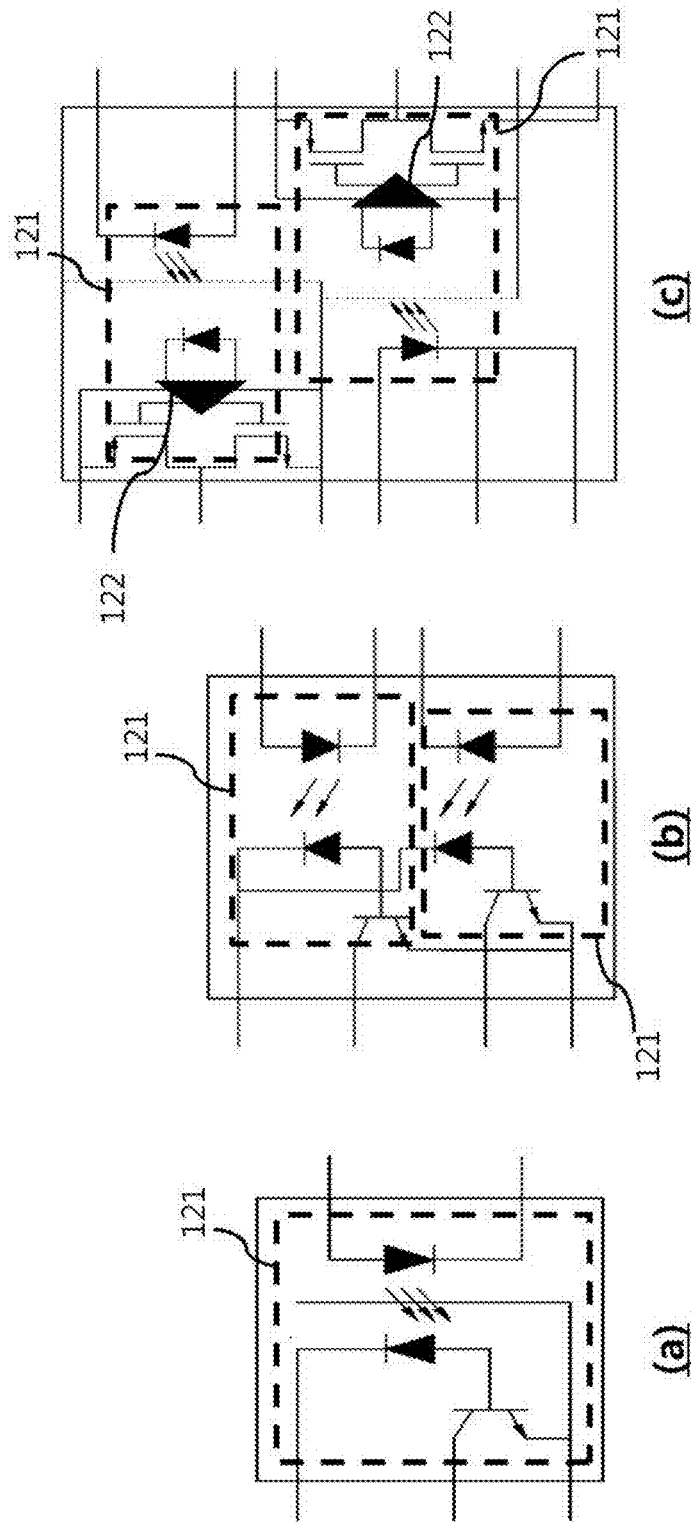

[Figure 4]
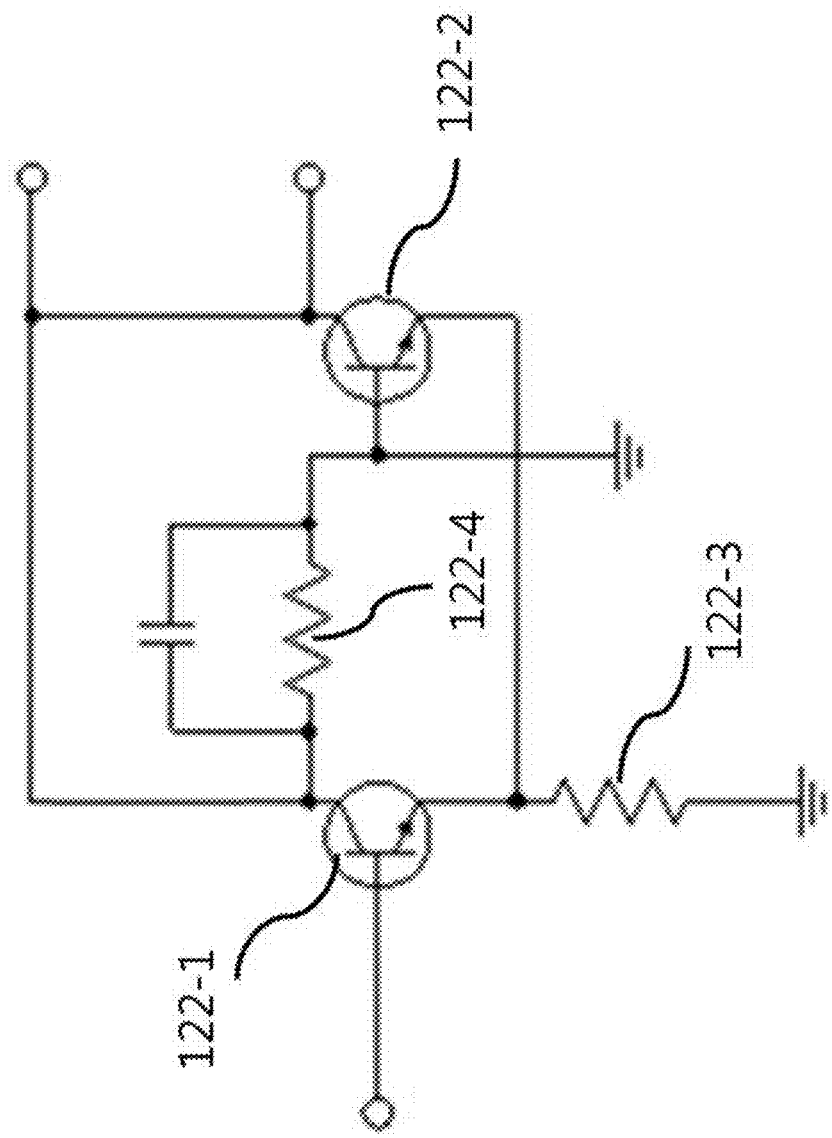

[Figure 5]
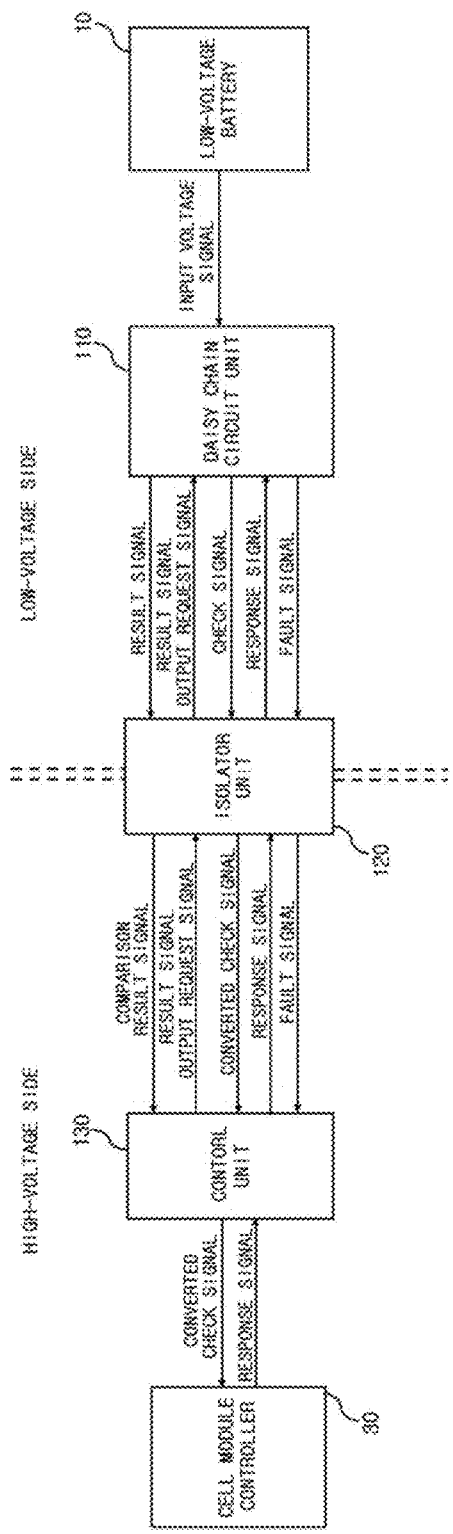

[Figure 6]
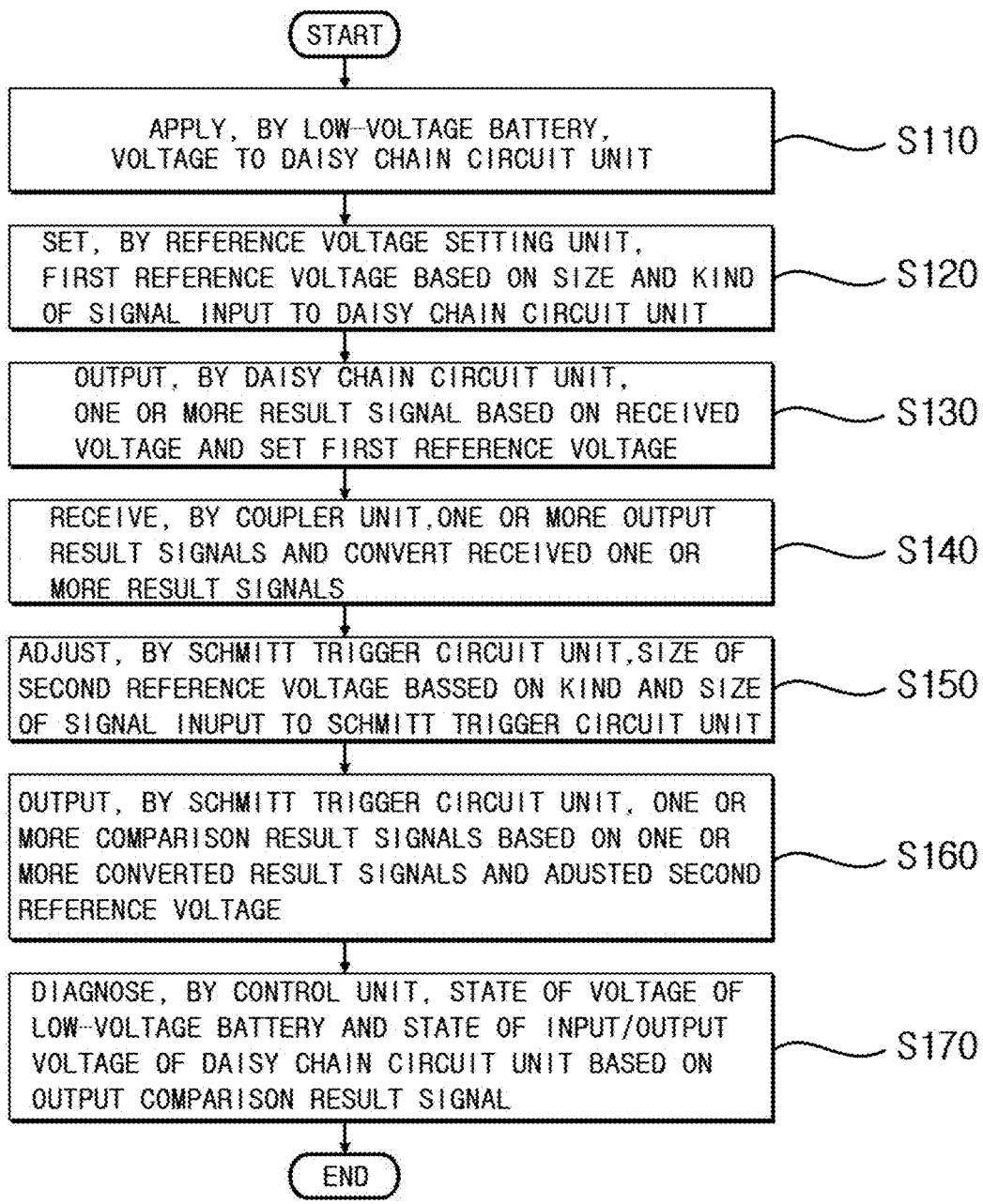

[Figure 7]
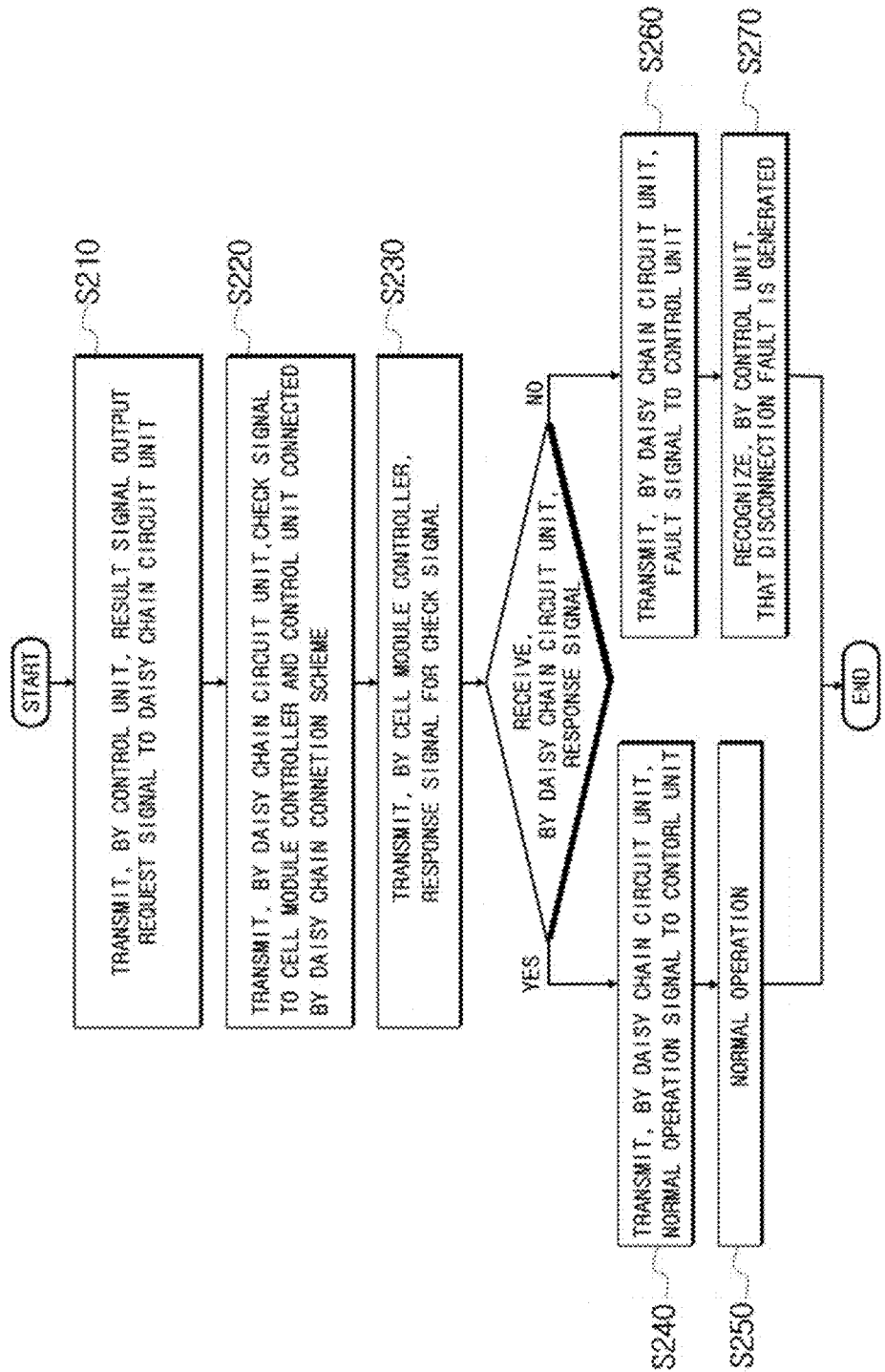

SYSTEM AND METHOD FOR DIAGNOSING LOW-VOLTAGE BATTERY STATE

TECHNICAL FIELD

THIS APPLICATION claims priority to and the benefit of Korean Patent Application No. 10-2017-0044680 filed in the Korean Intellectual Property Office on Apr. 6, 2017, the entire contents of which are incorporated herein by reference.

The present invention relates to a system and a method of diagnosing a state of a low-voltage battery, and more particularly, to a system and a method of diagnosing a state of a low-voltage battery, in which, in order to diagnose a state of a low-voltage battery (12V aux battery) provided at a low-voltage side, a daisy chain circuit unit receives a voltage from the low-voltage battery and outputs one or more result signals, and an isolator unit, which electrically insulates a high-voltage side and the low-voltage side, converts the one or more result signals output from the daisy chain circuit unit and provides the converted signals to a control unit, thereby diagnosing a state of the low-voltage battery at the low-voltage side by using the control unit provided at the high-voltage side without additionally providing a control unit at the low-voltage side.

BACKGROUND ART

In general, a battery management system (BMS) developed and produced for managing a battery measures a voltage of a high-voltage battery provided at a high-voltage side and diagnoses and manages a voltage state of the battery based on the measured voltage through a control unit, such as a micro controller unit (MCU). However, since the control unit, such as the MCU, is not provided at a low-voltage side, there is a problem in that it is impossible to diagnose a voltage state of a low-voltage battery (12 V aux battery) provided at the low-voltage side.

In order to solve the problem, in order to diagnose a voltage state of a low-voltage battery, a BMS in the related art uses a scheme of distributing a voltage of a low-voltage battery by resistance distribution, applying the distributed voltage to an MCU located at a low-voltage side, and diagnosing a voltage state of the low-voltage battery.

In the meantime, in the scheme of diagnosing a state of a low-voltage battery in the related art, a constituent element serving as an additional control unit needs to be provided at the low-voltage side, in addition to the control unit provided at the high-voltage side, so that there is a problem in that manufacturing cost and volume of an entire system are increased to degrade entire efficiency of the BMS.

In this respect, in order to solve the problems of a system and a method of diagnosing a state of a low-voltage battery in the related art, the present inventors invented a system and a method of diagnosing a state of a low-voltage battery, in which, in order to diagnose a state of a low-voltage battery provided at a low-voltage side, a daisy chain circuit unit receives a voltage from the low-voltage battery and outputs one or more result signals, and an isolator unit, which electrically insulates a high-voltage side and the low-voltage side, converts the one or more result signals output from the daisy chain circuit unit and provides the converted signals to a control unit, thereby diagnosing a state of the low-voltage battery at the low-voltage side by using the control unit provided at the high-voltage side without additionally providing a control unit at the low-voltage side.

DETAILED DESCRIPTION OF THE INVENTION

Technical Problem

The present invention is conceived to solve the problems, and provides a system and a method of diagnosing a state of a low-voltage battery, in which, in order to diagnose a state of a low-voltage battery (12V aux battery) provided at a low-voltage side, a daisy chain circuit unit receives a voltage from the low-voltage battery and outputs one or more result signals, and an isolator unit, which electrically insulates a high-voltage side and the low-voltage side, converts the one or more result signals output from the daisy chain circuit unit and provides the converted signals to a control unit, thereby diagnosing a state of the low-voltage battery at the low-voltage side by using the control unit provided at the high-voltage side without additionally providing a control unit at the low-voltage side.

Technical Solution

An exemplary embodiment of the present invention provides a system for diagnosing a state of a low-voltage battery, the system including: a daisy chain circuit unit configured to receive a voltage from a low-voltage battery, and output one or more result signals based on the received voltage and a first reference voltage; an isolator unit configured to receive the one or more output result signals, and convert the one or more received result signals; and a control unit configured to receive the one or more converted result signals and diagnose the state of the low-voltage battery, in which the daisy chain circuit unit is provided at a low-voltage side including the low-voltage battery, and the control unit is provided at a high-voltage side including a high-voltage battery.

In the exemplary embodiment, the isolator unit may be located between the daisy chain circuit unit and the control unit, and insulates and electrically isolate the daisy chain circuit unit and the control unit.

In the exemplary embodiment, the daisy chain circuit unit may include a reference voltage setting unit configured to set the first reference voltage, and adjust a size of the first reference voltage based on one or more of a size and kind of signal input to the daisy chain circuit unit.

In the exemplary embodiment, the isolator unit may include: a coupler unit configured to convert the one or more received result signals; and a Schmitt trigger circuit unit configured to compare the one or more converted result signals with a second reference voltage and output one or more comparison result signals.

In the exemplary embodiment, the Schmitt trigger circuit unit may further be configured to adjust a size of the second reference voltage according to a size and a kind of signal input to the Schmitt trigger circuit unit.

In the exemplary embodiment, the daisy chain circuit unit may further be configured to output the one or more result signals based on a voltage signal of the low-voltage battery, and output one or more of an input voltage signal of the daisy chain circuit unit and a feedback signal of an output voltage of the daisy chain circuit unit.

In the exemplary embodiment, the daisy chain circuit unit may be connected with one or more cell module controllers (CMCs), each CMC being connected with a respective battery module, the one or more CMCs are connected to the control unit by a daisy chain connection scheme, and the daisy chain circuit unit may check disconnection between the one or more CMCs, the control unit, and the daisy chain circuit unit based on the one or more result signals.

Another exemplary embodiment of the present invention provides a method of diagnosing a state of a low-voltage battery, the method including: providing a daisy chain circuit unit at a low-voltage side including the low-voltage battery; providing a control unit at a high-voltage side including a high-voltage battery; receiving, by the daisy chain circuit unit, a voltage from the low-voltage battery, and outputting one or more result signals based on the received voltage and a first reference voltage; receiving, by an isolator unit, the one or more output result signals, and converting the one or more received result signals; and receiving, by the control unit, the one or more converted result signals and diagnosing a state of the low-voltage battery.

In the exemplary embodiment, the converting of the one or more result signals may include insulating and electrically isolating, by the isolator unit, the low-voltage battery, the daisy chain circuit unit, and the control unit, the isolator unit being located between the low-voltage battery and control unit, and between the daisy chain circuit, unit and the control unit.

In the exemplary embodiment, the outputting of the one or more result signals may include setting, by a reference voltage setting unit, the first reference voltage, and the setting of the first reference voltage may include adjusting a size of the first reference voltage based on one or more of a size and a kind of signal input to the daisy chain circuit unit.

In the exemplary embodiment, the outputting of the one or more result signals may include: converting, by a coupler unit, the one or more received result signals; and comparing, by a Schmitt trigger circuit unit, the one or more converted result signals with a second reference voltage and outputting one or more comparison result signals.

In the exemplary embodiment, the outputting of the one or more comparison result signals may include adjusting a size of the second reference voltage according to a size and a kind of signal input to the Schmitt trigger circuit unit.

In the exemplary embodiment, the outputting of the one or more result signals may include outputting the one or more result signals based on a voltage signal of the low-voltage battery, and one or more of an input voltage signal of the daisy chain circuit unit and a feedback signal of an output voltage of the daisy chain circuit unit.

In the exemplary embodiment, the method may further include connecting the daisy chain circuit unit with one or more cell module controllers (CMCs), each CMC being connected with a respective battery module, the one or more CMCs are connected to the control unit by a daisy chain connection scheme, in which the outputting of the one or more result signals may include checking disconnection between the one or more CMCs, the control unit, and the daisy chain circuit unit based on the one or more result signals.

Advantageous Effect

According to the present invention, in order to diagnose a state of a low-voltage battery (12V aux battery) provided at a low-voltage side, a daisy chain circuit unit receives a voltage from the low-voltage battery and outputs one or more result signals, and an isolator unit, which electrically insulates a high-voltage side and the low-voltage side, converts the one or more result signals output from the daisy chain circuit unit and provides the converted signals to a control unit, so that it is possible to diagnose a state of the low-voltage battery at the low-voltage side by using the control unit provided at the high-voltage side without additionally providing a control unit at the low-voltage side, and there is no need for a control unit for diagnosing a state of the low-voltage battery at the low-voltage side, thereby decreasing cost and a volume of the system.

Further, the present invention receives feedback signals of an input voltage and an output voltage of the daisy chain circuit unit and sets a reference voltage based on the kind and a size of the received signal, so that it is possible to diagnose an input/output state of the daisy chain circuit unit provided at the low-voltage side, as well as a voltage of the low-voltage battery, and even when the input signal is changed, it is possible to receive various signals and diagnose a state of the low-voltage battery because a unique characteristic of the present invention is not changed.

BRIEF DESCRIPTION OF DRAWINGS

FIG. 1 is a diagram schematically illustrating constituent elements of a low-voltage battery state diagnosing system 100 according to an exemplary embodiment of the present invention.

FIG. 2 is a diagram schematically illustrating a reference voltage setting unit 111 included in a daisy chain circuit unit 110 in the low-voltage battery state diagnosing system 100 according to the exemplary embodiment of the present invention.

FIG. 3 is a diagram schematically illustrating a coupler unit 121 and a Schmitt trigger circuit unit 122 included in an isolator unit 120 in the low-voltage battery state diagnosing system 100 according to the exemplary embodiment of the present invention.

FIG. 4 is a diagram illustrating an example of the Schmitt trigger circuit unit 122 included in the isolator unit 120 in the low-voltage battery state diagnosing system 100 according to the exemplary embodiment of the present invention.

FIG. 5 is a diagram schematically illustrating a form in which the daisy chain circuit unit 110, the isolator unit 120, and the control unit 130 transceive one or more result signals in the low-voltage battery state diagnosing system 100 according to the exemplary embodiment of the present invention.

FIG. 6 is a flowchart for describing a series of processes of diagnosing a state of a low-voltage battery 10 through the low-voltage battery state diagnosing system 100 according to the exemplary embodiment of the present invention.

FIG. 7 is a flowchart for describing a series of processes of checking disconnection between a cell module controller 30, a control unit 130, and a daisy chain circuit unit 110 by using the low-voltage battery state diagnosing system 100 according to the exemplary embodiment of the present invention.

MODE FOR CARRYING OUT THE INVENTION

Hereinafter, an exemplary embodiment is presented for helping understanding of the present invention. However, the exemplary embodiment below is simply provided for easier understanding of the present invention, and the contents of the present invention are not limited by the exemplary embodiment.

FIG. 1 is a diagram schematically illustrating constituent elements of a low-voltage battery state diagnosing system 100 according to an exemplary embodiment of the present invention.

Referring to FIG. 1, the low-voltage battery state diagnosing system 100 according to the exemplary embodiment of the present invention may include a daisy chain circuit unit 110, an isolator unit 120, and a control unit 130.

First, the daisy chain circuit unit 110 may receive a voltage from a low-voltage battery 10, and provide the received voltage of the low-voltage battery 10 to a plurality of constituent elements included in the daisy chain circuit unit 110. To this end, the daisy chain circuit unit 110 may be provided at a low-voltage side including the low-voltage battery 10. Herein, the low-voltage battery 10 may be a battery outputting a relatively low voltage value than that of a high-voltage battery 20, which is to be described below. For example, the low-voltage battery 10 may be one battery module among a plurality of battery modules included in the high-voltage battery 20, and may be one battery cell among a plurality of battery cells included in a battery module.

The daisy chain circuit unit 110 may be the form of one circuit formed by connecting constituent elements, such as a hardware device, a software device, and a communication device, provided at the low-voltage side, by a daisy chain connection scheme. Herein, the daisy chain connection scheme may mean a bus connection scheme in which constituent elements are continuously connected, and for example, the daisy chain circuit unit 110 may connect the constituent elements by a small computer system interface (SCSI) scheme.

The daisy chain circuit unit 110 may output one or more result signals based on the voltage received from the low-voltage battery 10 and a first reference voltage. Herein, the first reference voltage may mean a size value of a voltage serving as a reference for diagnosing a voltage state of the low-voltage battery 10. Further, the first reference voltage may include two reference voltages, that is, a high-voltage reference voltage and a low-voltage reference voltage, for diagnosing whether the low-voltage battery 10 is in a low-voltage state or a high-voltage state. Herein, one or more result signals may be signals output by comparing the voltage received from the low-voltage battery 10 with the first reference voltage.

In the exemplary embodiment, the daisy chain circuit unit 110 may include a comparator circuit (not illustrated). The daisy chain circuit unit 110 may compare the voltage received from the low-voltage battery 10 with the first reference voltage through the comparator circuit, and output a high-signal or a low-signal as a comparison result. In this case, the high-signal or the low-signal may be the one or more result signals.

In the exemplary embodiment, the daisy chain circuit unit 110 may receive any one or more of an input voltage signal of the daisy chain circuit unit 110 and a feedback signal of an output voltage of the daisy chain circuit unit, as well as the voltage signal received from the low-voltage battery 10, and may output one or more result signals based on the received signal. In this case, the when the same first reference voltage is applied regardless of the kind of signal received by the daisy chain circuit unit 110, it may be impossible to accurately output a result value for each signal. To this end, the daisy chain circuit unit 110 may include a reference voltage setting unit 111 for setting the first reference voltage so as to correspond to each received signal.

In the exemplary embodiment, the reference voltage setting unit 111 may adjust a size of the first reference voltage based on any one or more of a size and the kind of signal input to the daisy chain circuit unit 110. Hereinafter, a series of processes of adjusting a size of a reference voltage by the reference voltage setting unit 111 will be described with an example with reference to FIG. 2.

FIG. 2 is a diagram schematically illustrating the reference voltage setting unit 111 included in the daisy chain circuit unit 110 in the low-voltage battery state diagnosing system 100 according to the exemplary embodiment of the present invention.

In the exemplary embodiment, the reference voltage setting unit 111 may adjust a size of the first reference voltage so as to correspond to each signal received by the daisy chain circuit unit 110, and to this end, the reference voltage setting unit 111 may include one or more resistors 111-1 to 111-3 and a switching element 111-4. The reference voltage setting unit 111 may adjust a size of the first reference voltage according to a size and the kind of signal input to the daisy chain circuit unit 110. For example, when a voltage Vcc having a predetermined size is input to the reference voltage setting unit 111, the voltage is distributed through the first resistor 111-1 and the second resistor 111-2 to generate the first reference voltage. In this case, when the voltage Vcc having the predetermined size is 10 V, and the sizes of the first resistor 111-1 and the second resistor 111-2 are 3 KΩ and 2 KΩ, respectively, a voltage of 6 V is generated through the voltage distribution, and the reference voltage setting unit 111 may set the generated voltage having the size of 6 V as the first reference voltage. In this case, when the reference voltage setting unit 111 desires to adjust the size of the first reference voltage based on the size and the kind of signal input to the daisy chain circuit unit 110, a size of distributed voltage may be adjusted by controlling a conduction state of the switching element 111-4 based on a control signal of the switching element 111-4 output from the daisy chain circuit unit 110 or the control unit 130, which is to be described below, and changing a resistance value by connecting the second resistor 111-2 and the third resistor 111-3, thereby adjusting the size of the first reference voltage. For example, the third resistor 111-3 is a variable resistor or may be a resistor in which one or more resistors are connected serially or in parallel, so that a resistance value of the third resistor 111-3 may be adjusted, and various resistance values may be generated by connecting the third resistor 111-3, of which the resistance value is adjusted, and the second resistor 111-2.

In another exemplary embodiment, the daisy chain circuit unit 110 may include a storage unit (not illustrated) which is capable of storing information about the first reference voltage. The storage unit may make the first reference voltage, which is to be set based on the size and the kind of signal input to the daisy chain circuit unit 110, in the form of data and store the first reference voltage in the form of data, and when a specific signal is input to the daisy chain circuit unit 110, the reference voltage setting unit 111 may match the first reference voltage corresponding to the kind and a size of the specific signal and set the matched first reference voltage as the first reference voltage.

Referring back to FIG. 1, the isolator unit 120 may receive the one or more result signals output from the daisy chain circuit unit 110, and convert the received one or more result signals. Hereinafter, a process of converting the one or more result signals received from the daisy chain circuit unit 110 by the isolator unit 120 will be described with reference to FIG. 3.

FIG. 3 is a diagram schematically illustrating a coupler unit 121 and a Schmitt trigger circuit unit 122 included in the isolator unit 120 in the low-voltage battery state diagnosing system 100 according to the exemplary embodiment of the present invention.

Referring to FIG. 3, the isolator unit 120 may include a coupler unit and a Schmitt trigger circuit unit.

The coupler unit 121 may convert the one or more result signals received from the daisy chain circuit unit 110. For example, the coupler unit 121 may be an opto coupler or a photo coupler performing a switching operation by using a light source and an optical detector. The coupler unit 121 may generate a light signal from a light source based on the one or more result signals received from the daisy chain circuit unit 110, and the optical detector may detect the light signal and generate an electric signal. Through the process, the one or more result signals may be converted into the light signal or the light signal may be converted into another electric signal.

The Schmitt trigger circuit unit 122 may compare the one or more result signals converted through the coupler unit 121 with a second reference voltage and output one or more comparison result signals. Herein, the second reference voltage may be a threshold voltage of the Schmitt trigger circuit unit 122, and may include a low-voltage reference voltage and a high-voltage reference voltage in order to diagnose a low-voltage state and a high-voltage state of a signal. Further, the second reference voltage may be the voltage serving as a reference for diagnosing, by the control unit 130, which is to be described below, a voltage state of the low-voltage battery 10 and an input/output voltage state of the daisy chain circuit unit 110.

The isolator unit 120 may be formed of one coupler unit 121 as illustrated in FIG. 3A, and may be formed of two coupler units 121 or the plurality of coupler units 121 as illustrated in FIG. 3B. Further, as illustrated in FIG. 3C, the plurality of coupler units 121 and the Schmitt trigger circuit unit 122 may be coupled and used. Hereinafter, the Schmitt trigger circuit unit 122 will be described in more detail with reference to FIG. 4.

FIG. 4 is a diagram illustrating the Schmitt trigger circuit unit 122 included in the isolator unit 120 in the low-voltage battery state diagnosing system 100 according to the exemplary embodiment of the present invention in more detail.

In the exemplary embodiment, the Schmitt trigger circuit unit 122 may be coupled by resistor-dividing two transistors 122-1 and 122-2 into the plurality of resistors 122-3 and 122-4 and coupling emitter terminals. When the converted one or more result signals are input to a base terminal of the first transistor 122-1 and a base potential of the first transistor 122-1 is low, the first transistor 122-1 is in an off state and the second transistor 122-2 is in an on state. Further, an emitter current of the second transistor 122-2 flows in the first resistor 122-3, so that the emitter potential of the first transistor is increased and the first transistor 122-1 seeks to maintain the off state. Further, since a collector terminal of the first transistor has a high potential, since the secondary transistor (122-4) has a base current flowing through its secondary resistance (122-4), the secondary transistor (122-2) seeks to maintain the on state. Accordingly, the first transistor 122-1 and the second transistor 122-2 may maintain a stable state in which the first transistor 122-1 is in the off state and the second transistor 122-2 is in the on state. In this case, when abnormality is generated in the one or more input result signals and a voltage size of the signal is increased and exceeds the second reference voltage, the base current of the first transistor 122-1 starts to flow, and thus, a collector voltage is decreased and the base current and the emitter current of the second transistor 122-2 are decreased. In this case, the base current of the first transistor 122-1 is sharply increased, so that momentarily, the first transistor 122-1 becomes the on state and the second transistor becomes the off state, and thus, a hysteresis voltage is generated.

That is, the one or more comparison result signals output by the Schmitt trigger circuit unit 122 may be output signals of the hysteresis voltage. Herein, when the Schmitt trigger circuit unit 122 applies the same second reference voltage regardless of the kind of received signal, it may be impossible to accurately output a comparison result value for each signal. Accordingly, the Schmitt trigger circuit unit 122 may adjust a size of the second reference voltage according to the size and the kind of signal input to the Schmitt trigger circuit unit 122.

In the exemplary embodiment, when the first transistor 122-1 and the second transistor 122-2 included in the Schmitt trigger circuit unit 122 are metal oxide silicon field effect transistors (MOSFETs), a variable circuit is additionally installed so that an additional current may flow in the drain terminal and a source terminal of the MOSFET in parallel, and the second reference voltage may be changed by a scheme of adjusting a rate of the current flowing in the MOSFET.

Referring back to FIG. 1, the control unit 130 may receive the one or more result signals converted from the isolator unit 120, and diagnose a voltage state of the low-voltage battery 10 based on the received one or more result signals.

In the exemplary embodiment, the control unit 130 may be provided at the high-voltage side including the high-voltage battery 20, in which the plurality of battery modules is joined and used. For example, the control unit 130 may be a battery management system (BMS) used for diagnosing and controlling a state of the high-voltage battery 20, in which the plurality of battery modules is joined, and a micro controller unit (MCU) substantially taking charge of control within the BMS. That is, the control unit 130 may be provided at the high-voltage side, and the daisy chain circuit unit 110 may be provided at the low-voltage side. In the meantime, when a difference in a voltage is large between the high-voltage side and the low-voltage side, the voltage applied to the high-voltage side influences the constituent elements provided at the low-voltage side, thereby generating a fault.

In the exemplary embodiment, the isolator unit 120 may be positioned between the daisy chain circuit unit 110 and the control unit 130, and insulate and electrically isolate the daisy chain circuit unit 110 from the control unit 130. Accordingly, the low-voltage battery state diagnosing system 100 according to the exemplary embodiment of the present invention insulates the voltage signal of the low-voltage battery 10 through the isolator unit 120 and transmits the insulated voltage signal to the control unit 130 located at the high-voltage side, thereby diagnosing a voltage state of the low-voltage battery 10 by using the control unit 130 provided at the high-voltage side without providing a control device, such as an MCU, at the low-voltage side.

In the exemplary embodiment, the daisy chain circuit unit 110, the control unit 120, and one or more cell module controllers (CMCs) 30 may be connected by a daisy chain connection scheme, and a disconnection between the CMC 30, the control unit 130, and the daisy chain circuit unit 120 may be checked based on the one or more result signals output from the daisy chain circuit unit 120. As an example, the control unit 130 may output a result signal output request signal and request for an output of a result signal from the daisy chain circuit unit 120 in order to check a disconnection between the CMC 30, the control unit 130, and the daisy chain circuit unit 120. When the isolator unit 120 receives the result signal output request signal for checking the disconnection, the isolator unit 120 may transmit a check signal to the one or more CMCs 30 connected by the daisy chain disconnection scheme as a result signal, and receive a response feedback signal to the check signal from the CMC 30. In this case, when the disconnection is generated, the check signal may not be transmitted or the feedback response signal may not be received. Accordingly, when the check signal is not transmitted or the feedback signal is not received as the response to the check signal, the isolator unit 120 may transmit a fault signal to the control unit 130 and the control unit 130 may recognize that a disconnection fault is generated. Herein, when the isolator unit 120 receives the feedback response signal, the isolator unit 120 may transmit a normal operation signal to the control unit 130.

In another exemplary embodiment, when the check signal is not transmitted or the feedback signal is not received as the response to the check signal, the isolator unit 120 may not transmit a response signal to the signal, which requests for outputting the result signal for checking the disconnection to the control unit 130 by the control unit 130, and when the control unit 130 fails to receive the signal for a predetermined time, the control unit 130 may diagnose that a disconnection fault is generated.

As described above, in the low-voltage battery state diagnosing system 100 according to the exemplary embodiment of the present invention, the daisy chain circuit unit 110 receives a voltage from the low-voltage battery 10 and outputs one or more result signals, and the isolator unit 120, which electrically isolates the high-voltage side and the low-voltage side, converts the one or more output result signals and provides the converted signals to the control unit 130, thereby diagnosing a state of the low-voltage battery 10 at the low-voltage side by using the control unit located at the high-voltage side. Hereinafter, one or more result signals transceived by the low-voltage battery 10, the daisy chain circuit unit 110, the isolator unit 120, and the control unit 130 for diagnosing a voltage state of the low-voltage battery 10 and an input/output voltage state of the daisy chain circuit unit 110 will be described in more detail with reference to FIG. 5.

FIG. 5 is a diagram schematically illustrating a form in which the daisy chain circuit unit 110, the isolator unit 120, and the control unit 130 transceive one or more result signals in the low-voltage battery state diagnosing system 100 according to the exemplary embodiment of the present invention.

Referring to FIG. 5, the low-voltage battery 10 outputs an input voltage signal to the daisy chain circuit unit. The daisy chain circuit unit 110 receiving the input voltage signal converts the input voltage signal and outputs a result signal, and transmits the output result signal to the isolator unit 120. Herein, one or more result signals may be output. For example, the result signal may include the input voltage signal and an output voltage signal for the input voltage signal. The isolator unit 120 may convert the received result signal and output a comparison result signal, and the control unit 130 may receive the comparison result signal and diagnose a voltage state of the low-voltage battery 10.

The control unit 130 may transmit a result signal output request signal to the daisy chain circuit unit 110, and the daisy chain circuit unit 110 may transmit a check signal for checking a disconnection. The cell module controller 30 transmits a response signal as a response to the check signal to the daisy chain circuit unit 110. In this case, when the response signal is not received, the daisy chain circuit unit 110 may transmit a fault signal to the control unit 130.

Hereinafter, a series of processes of diagnosing a voltage state of the low-voltage battery 10 and a state of an input/output voltage of the daisy chain circuit unit 110 by using the low-voltage battery state diagnosing system 100 according to the exemplary embodiment of the present invention will be described with reference to FIGS. 6 and 7.

FIG. 6 is a flowchart for describing a series of processes of diagnosing a state of the low-voltage battery 10 through the low-voltage battery state diagnosing system 100 according to the exemplary embodiment of the present invention.

First, when the low-voltage battery state diagnosing system according to the exemplary embodiment of the present invention is initiated, the low-voltage battery applies a voltage to the daisy chain circuit unit (S110). The reference voltage setting unit included in the daisy chain circuit unit may set a first reference voltage based on a size and the kind of voltage input to the daisy chain circuit unit (S120), and the daisy chain circuit unit outputs one or more result signals based on the set first reference voltage and the applied voltage of the low-voltage battery (S130). The coupler unit receives the one or more result signals output in operation S130 and converts the received one or more result signals (S140). The one or more converted result signals are provided to the Schmitt trigger circuit unit, and the Schmitt trigger circuit unit adjusts a second reference voltage based on a size and the kind of signal input to the Schmitt trigger circuit unit (S150). Then, the Schmitt trigger circuit unit outputs a comparison result signal based on the one or more result signals converted in operation S140 and the second reference voltage adjusted in operation S150 (S160). The control unit may diagnose a voltage state of the low-voltage battery and an input/output voltage state of the daisy chain circuit unit based on the comparison result signal output in operation S160 (S170).

FIG. 7 is a flowchart for describing a series of processes of checking disconnection between the cell module controller 30, the control unit 130, and the daisy chain circuit unit 110 by using the low-voltage battery state diagnosing system 100 according to the exemplary embodiment of the present invention.

First, the control unit transmits a result signal output request signal to the daisy chain circuit unit (S210). When the daisy chain circuit unit receives the result signal output request signal transmitted in operation S210, the daisy chain circuit unit transmits a check signal to the control unit and the cell module controller which are connected by a daisy chain connection scheme (S220). When the cell module controller receives the check signal from the daisy chain circuit unit, the cell module controller transmits a response signal for the check signal to the control unit and the daisy chain circuit unit (S230). When the daisy chain circuit unit receives the response signal transmitted by the cell module controller in operation S230, the daisy chain circuit unit transmits a normal operation signal to the control unit (S240) and continuously performs a normal operation (S250). However, when the daisy chain circuit unit fails to receive the response signal transmitted by the cell module controller in operation S230, the daisy chain circuit unit transmits a fault signal to the control unit (S260), and when the control unit receives the fault signal transmitted in operation S260, the control unit recognizes that a disconnection fault is generated (S270).

As described above, in the low-voltage battery state diagnosing system 100 according to the exemplary embodiment of the present invention, the daisy chain circuit unit 110 provided at the low-voltage side receives a voltage from the low-voltage battery and outputs one or more result signals, and the isolator unit 120 converts the one or more result signals output from the daisy chain circuit unit and provides the converted one or more result signals to the control unit 130, thereby diagnosing a state of the low-voltage battery at the low-voltage side by using the control unit provided at the high-voltage side without additionally providing a control unit at the low-voltage side.

In this case, the isolator unit 120 electrically isolates the high-voltage side and the low-voltage side, thereby solving an insulation problem generable during the usage of the control unit 130 provided at the high-voltage side.

Further, the low-voltage battery state diagnosing system 100 according to the exemplary embodiment of the present invention receives feedback signals of an input voltage and an output voltage of the daisy chain circuit unit 110 and sets a reference voltage based on the kind and a size of the received signal, thereby diagnosing an input/output state of the daisy chain circuit unit 110 provided at the low-voltage side, as well as the voltage of the low-voltage battery 10.

In this case, even when the input signal is changed, it is possible to flexibly adjust and set the first reference voltage and the second reference voltage, so that a unique characteristic of the present invention is not changed, thereby receiving various kinds of signal and diagnosing a state of the low-voltage battery.

In the forgoing, the present invention has been described with reference to the exemplary embodiment of the present invention, but those skilled in the art may appreciate that the present invention may be variously corrected and changed within the range without departing from the spirit and the area of the present invention described in the appending claims.

The invention claimed is:

1. A system for diagnosing a state of a low-voltage battery, the system managing at least one first element in a low-voltage side and at least one second element in a high-voltage side, the system comprising:
   a daisy chain circuit unit configured to receive a voltage from the low-voltage battery, and output one or more result signals based on the received voltage and a first reference voltage, wherein the daisy chain circuit unit is a circuit including a plurality of connected elements;
   an isolator unit configured to receive the one or more result signals, and convert the one or more received result signals; and
   a control unit configured to receive the one or more converted result signals and diagnose the state of the low-voltage battery,
   wherein the daisy chain circuit unit is provided at the low-voltage side including the low-voltage battery, and the control unit is provided at the high-voltage side including a high-voltage battery.

2. The system of claim 1, wherein the isolator unit is located between the daisy chain circuit unit and the control unit, and insulates and electrically isolates the daisy chain circuit unit and the control unit.

3. The system of claim 1, wherein the daisy chain circuit unit includes a reference voltage setting unit configured to:
   set the first reference voltage, and
   adjust a size of the first reference voltage based on one or more of a size and a kind of signal input to the daisy chain circuit unit.

4. The system of claim 1, wherein the isolator unit includes:
   a coupler unit configured to convert the one or more received result signals; and
   a Schmitt trigger circuit unit configured to:
   compare the one or more converted result signals with a second reference voltage, and output one or more comparison result signals.

5. The system of claim 4, wherein the Schmitt trigger circuit unit is configured to adjust a size of the second reference voltage according to a size and a kind of signal input to the Schmitt trigger circuit unit.

6. The system of claim 1, wherein the daisy chain circuit unit is further configured to:
   receive a voltage signal from the low-voltage battery,
   receive an input voltage signal of the daisy chain circuit unit and a feedback signal of an output voltage of the daisy chain circuit unit,
   output a result signal based on the voltage signal, and
   output respective result signals based on the input voltage signal of the daisy chain circuit unit and the feedback signal of the output voltage of the daisy chain circuit unit.

7. The system of claim 1, wherein the daisy chain circuit unit is connected with one or more cell module controllers (CMCs), each CMC being connected with a respective battery module,
   wherein the one or more CMCs are connected to the control unit by a daisy chain connection scheme, and
   wherein the daisy chain circuit unit checks disconnection between the one or more CMCs, the control unit, and the daisy chain circuit unit based on the one or more result signals.

8. A method of diagnosing a state of a low-voltage battery in a system for managing at least one first element in a low-voltage side and at least one second element in a high-voltage side, the method comprising:
   providing a daisy chain circuit unit at the low-voltage side including the low-voltage battery, wherein the daisy chain circuit unit, is a circuit including a plurality of connected elements;
   providing a control unit at the high-voltage side including a high-voltage battery;
   receiving, by the daisy chain circuit unit, a voltage from the low-voltage battery, and outputting one or more result signals based on the received voltage and a first reference voltage;
   receiving, by an isolator unit, the one or more output result signals, and converting the one or more received result signals; and
   receiving, by the control unit, the one or more converted result signals and diagnosing a state of the low-voltage battery.

9. The method of claim 8, wherein the converting of the one or more result signals includes insulating and electrically isolating, by the isolator unit, the low-voltage battery, the daisy chain circuit unit, and the control unit, the isolator unit being located between the low-voltage battery and the control unit, and between the daisy chain circuit unit and the control unit.

10. The method of claim 8, wherein the outputting of the one or more result signals includes setting, by a reference voltage setting unit, the first reference voltage, and
   wherein the setting of the first reference voltage includes adjusting a size of the first reference voltage based on one or more of a size and a kind of signal input to the daisy chain circuit unit.

11. The method of claim 8, wherein the outputting of the one or more result signals includes:
   converting, by a coupler unit, the one or more received result signals; and comparing, by a Schmitt trigger circuit unit, the one or more converted result signals with a second reference voltage and outputting one or more comparison result signals.

12. The method of claim 11, wherein the outputting of the one or more comparison result signals includes adjusting a size of the second reference voltage according to a size and a kind of signal input to the Schmitt trigger circuit unit.

13. The method of claim 8, further comprising:
receiving an input voltage signal of the daisy chain circuit unit and a feedback signal of an output voltage of the daisy chain circuit unit; and
outputting respective result signals based on the input voltage signal of the daisy chain circuit unit and the feedback signal of the output voltage of the daisy chain circuit unit.

14. The method of claim 8, further comprising:
connecting the daisy chain circuit unit with one or more cell module controllers (CMCs), each CMC being connected with a respective battery module,
wherein the one or more CMCs are connected to the control unit by a daisy chain connection scheme, and
wherein the outputting of the one or more result signals includes checking disconnection between the one or more CMCs, the control unit, and the daisy chain circuit unit based on the one or more result signals.

* * * * *